(12) United States Patent
Chen

(10) Patent No.: US 7,936,551 B2
(45) Date of Patent: May 3, 2011

(54) ELECTRONIC DEVICE WITH ELECTROSTATIC GUIDING STRUCTURE

(75) Inventor: Yu-Hung Chen, Taipei (TW)

(73) Assignee: Inventec Corporation, Taipei (TW)

( * ) Notice: Subject to any disclaimer, the term of this patent is extended or adjusted under 35 U.S.C. 154(b) by 155 days.

(21) Appl. No.: 12/511,905

(22) Filed: Jul. 29, 2009

(65) Prior Publication Data

US 2010/0027184 A1    Feb. 4, 2010

(30) Foreign Application Priority Data

Jul. 30, 2008    (TW) ................................ 97128915 A

(51) Int. Cl.
*H02H 1/00*    (2006.01)
(52) U.S. Cl. ....................................... 361/220; 361/212
(58) Field of Classification Search .................. 361/212, 361/220
See application file for complete search history.

(56) References Cited

U.S. PATENT DOCUMENTS 6,421,221 B1 *   7/2002   Thomason et al. ........... 361/220
6,955,379 B1 *  10/2005   Annerino et al. ............... 292/83

* cited by examiner

*Primary Examiner* — Danny Nguyen
(74) *Attorney, Agent, or Firm* — Workman Nydegger

(57) ABSTRACT

An electronic device with an electrostatic guiding structure includes a metal case, a plastic case overlapping the metal case, a conductive strip, and an electrically insulating strip. The conductive strip is electrically connected to a conductive region of the plastic case, and has at least one tip portion. An end point of the tip portion is located at an edge of the electrically insulating strip, and separated from the metal case with the electrically insulating strip. The conductive region is electrically connected to a ground region of an electronic module. Therefore, when electrostatic charges accumulated in the metal case is above a specific value, the electrostatic charges are discharged to the ground region of the electronic module according to point discharge principle, thereby protecting user of the electronic device from getting an electric shock.

19 Claims, 10 Drawing Sheets

ELECTRONIC DEVICE WITH ELECTROSTATIC GUIDING STRUCTURE

CROSS-REFERENCE TO RELATED APPLICATIONS

This non-provisional application claims priority under 35 U.S.C. §119(a) on Patent Application No(s). 097128915 filed in Taiwan, R.O.C. on Jul. 30, 2008, the entire contents of which are hereby incorporated by reference.

BACKGROUND

1. Field of Invention

The present invention relates to an electrostatic discharge (ESD) guiding structure, and more particularly to an electronic device with an electrostatic guiding structure.

2. Related Art

Currently, with rapid development of the electronic technology, research and development personnel have researched and developed various electronic products to meet people's various demands, so as to make people's life and work convenient.

In recent years, portable electronic products have developed to be light, so as to be carried easily. Conventionally, the portable electronic products use metal cases. However, as functions of the portable electronic product become stronger, the weight of the portable electronic product has reached the limit and is difficult to be reduced as numerous electronic components are installed into the case of the portable electronic product.

Therefore, in order to reduce the weight of the portable electronic product, a plastic case is gradually used as the case. In spite of lightness, the plastic case is easily worn after prolonged use, and thus results in a poor appearance. In order to resist the wear, an outer case of the portable electronic product is made of a light aluminum magnesium alloy or aluminum metal.

Although such metal outer case is light in weight, wear resistant, and artistic in appearance, a plastic inner case is needed to isolate the electronic components and the metal outer case to form an electrical insulation there-between. Therefore, the metal outer case does not accumulate static electricity due to the leakage current generated by the electronic components, which causes the user to feel an electric shock when contacting with the metal outer case. However, in this design, the metal outer case does not have any ground mechanism, and thus the metal outer case may generate an electrostatic accumulation due to the grip of the user or accumulate the static electricity in nature for a long time. If the user contacts with the metal outer case when the static electricity is accumulated to a certain value, the user feels the electric shock due to a potential difference between an electrostatic value of the user and that of the metal outer case.

Therefore, how to eliminate the electrostatic charge accumulated by the metal outer case is in fact a problem to be solved in the industry.

SUMMARY

In view of the above problem, the present invention is directed to an electronic device with an electrostatic guiding structure, so as to meet the demand to use a metal material as an outer case of the electronic device and avoid the phenomenon of an electrostatic shock when the user contacts with the metal outer case.

The present invention provides an electronic device with an electrostatic guiding structure. The electronic device includes a metal case, an electronic module, a plastic case, a conductive strip and an electrically insulating strip. The electronic module is disposed in the metal case and has a ground region. The plastic case is disposed between the metal case and the electronic module, and the plastic case has a conductive region. The conductive region is electrically connected to the ground region of the electronic module. One end of the conductive strip is electrically connected to the conductive region, and the other end of the conductive strip has at least one end point (also called as a discharge point). The electrically insulating strip is disposed between the metal case and the conductive strip, and the end point of the conductive strip is located at an edge of the electrically insulating strip, such as the electrically insulating strip separates the end point of the conductive strip from the metal case by a specific distance.

The specific distance may be a thickness of the electrically insulating strip. Herein, the specific distance may be approximately between 0.02 millimeter (mm) and 0.6 mm.

Herein, an edge of the conductive strip may be designed to be a tip portion, and an end point of the tip portion is used as the end point. Therefore, when the amount of the static electricity accumulated by the metal case exceeds a specific value, the electrostatic charge jumps from the metal case to the end point of the tip portion of the conductive strip, and thus is guided to the conductive region of the plastic case and the ground region of the electronic module. In this manner, the electrostatic charge of the metal case can be guided to the ground smoothly without causing the phenomenon of the electrostatic shock to the user. Meanwhile, since no electrical connection exists between the metal outer case and the electronic module, the phenomenon of a leakage current does not occur.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The detailed features and advantages of the present invention are described below in great detail through the following embodiments, the content of the detailed description is sufficient for those skilled in the art to understand the technical content of the present invention and to implement the present invention there accordingly. Based upon the content of the specification, the claims, and the drawings, those skilled in the art can easily understand the relevant objectives and advantages of the present invention. The following embodiments are intended to describe the present invention in further detail, but not intended to limit the scope of the present invention in any way.

Figure 1A:
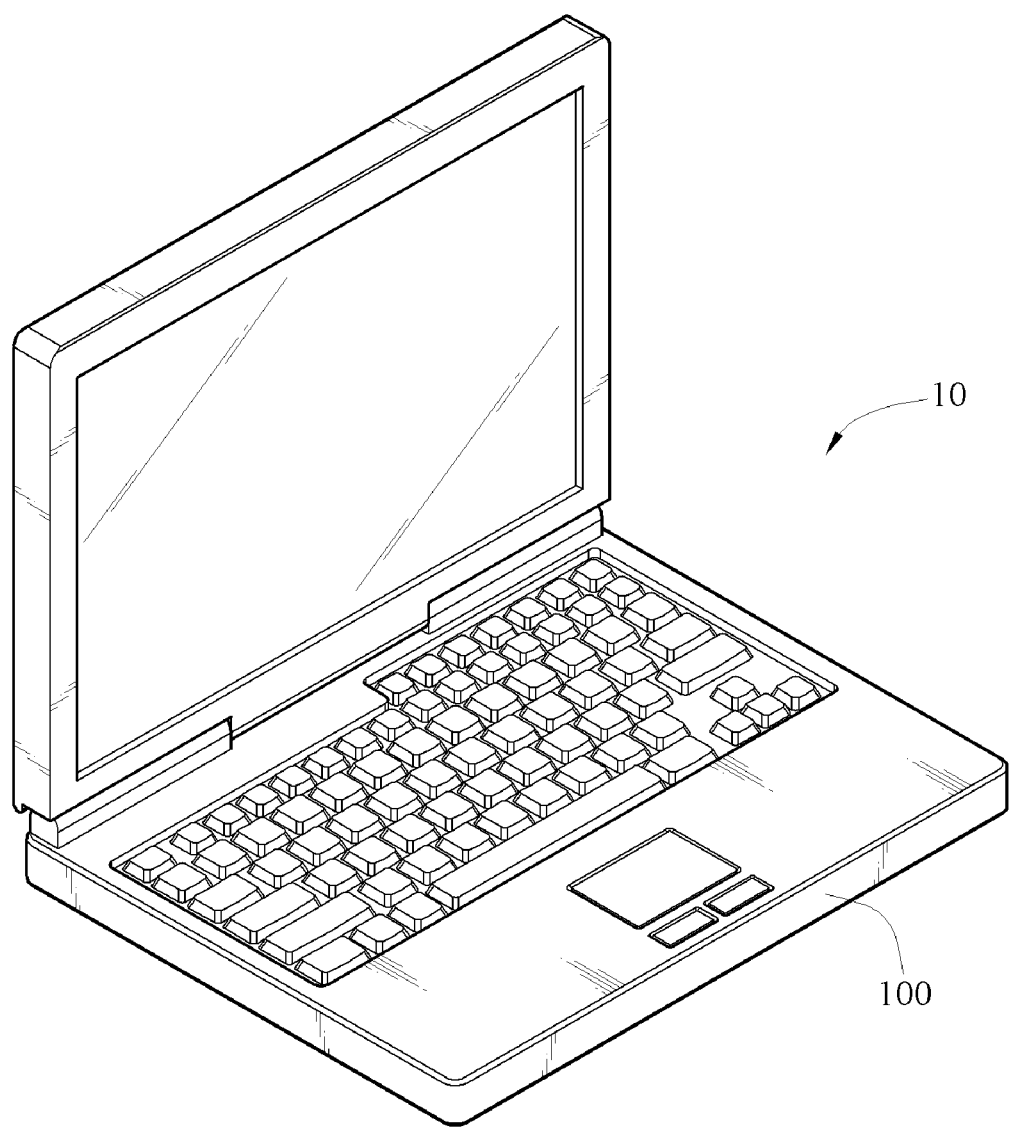
FIG. 1A is a schematic three-dimensional view of an electronic device with an electrostatic guiding structure according to an embodiment of the present invention.
Figure 1B:
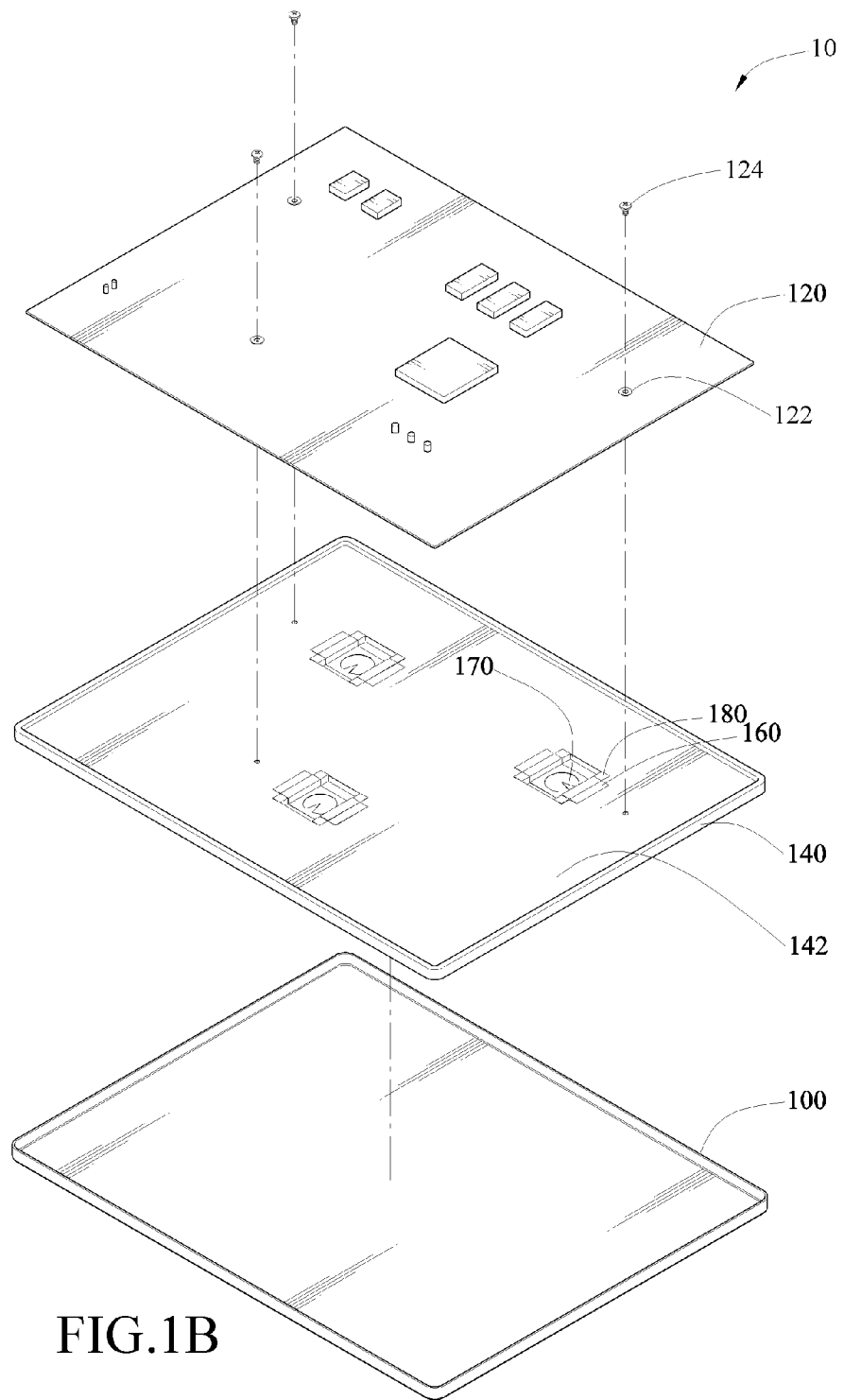
FIG. 1B is a schematic exploded three-dimensional view of the electronic device with the electrostatic guiding structure according to the embodiment of the present invention.

FIGS. 1A and 1B are respectively a schematic three-dimensional view and a partial exploded three-dimensional view of an electronic device with an electrostatic guiding structure according to an embodiment of the present invention.

The electronic device 10 with the electrostatic guiding structure includes a metal case 100, an electronic module 120, a plastic case 140, a conductive strip 160, and an electrically insulating strip 180.

The electronic device 10 with the electrostatic guiding structure may be, but not limited to, a computer, a portable electronic device, a notebook computer, a personal digital assistant, a mobile phone, and the like.

Figure 1C:
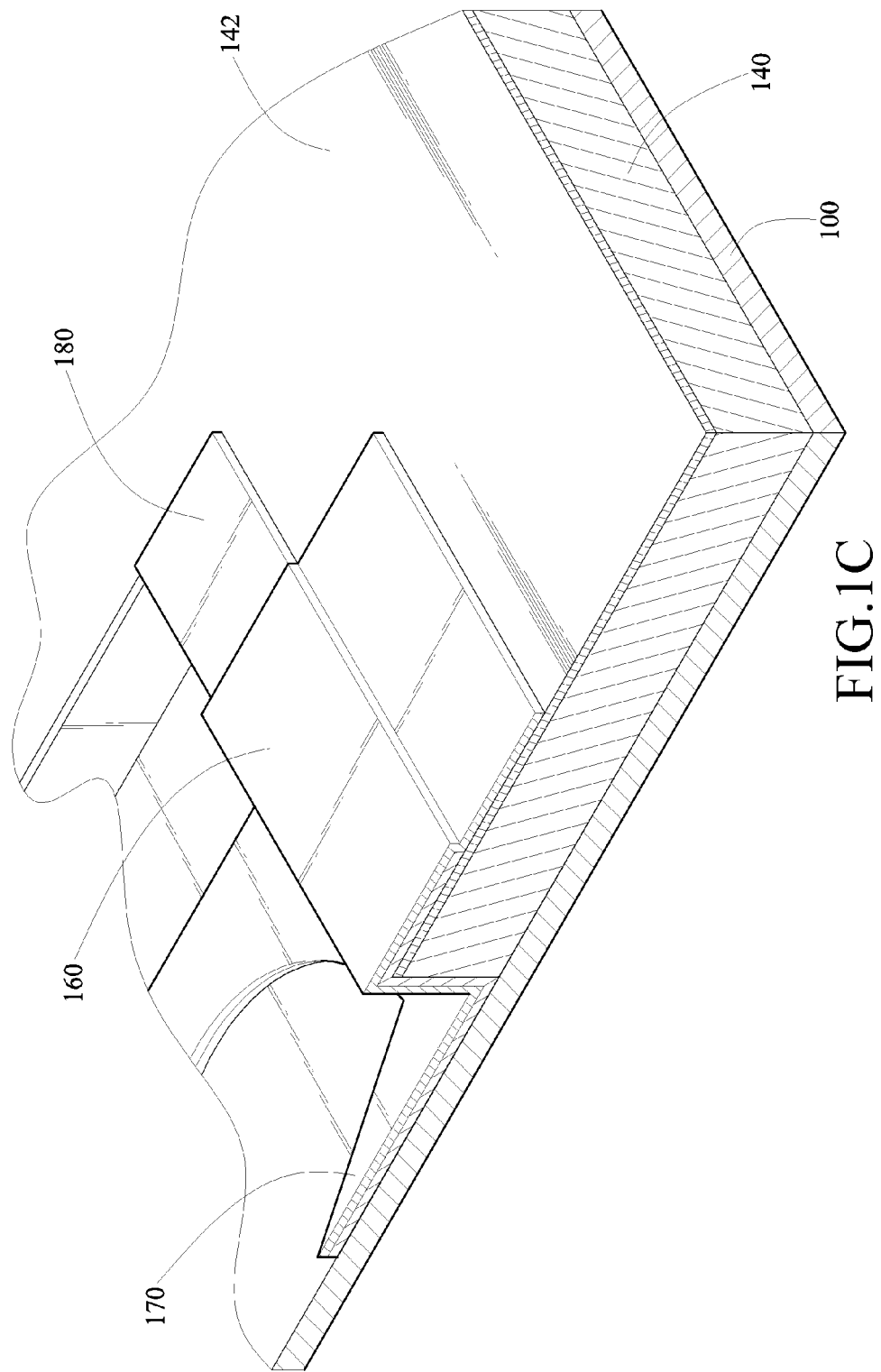
FIG. 1C is a schematic partial enlarged view of the electronic device with the electrostatic guiding structure according to the embodiment of the present invention.

Referring to FIG. 1C together, the aforementioned metal case 100 is used to accommodate the electronic module 120 and the plastic case 140 of the electronic device 10 with the electrostatic guiding structure. The plastic case 140 is sandwiched between the metal case 100 and the electronic module 120, and the electronic module 120 has a ground region 122. The electronic module 120 may be, but not limited to, a circuit board, and the ground region 122 may be a ground layer of the circuit board or a ground contact on a surface of the circuit board.

Figure 1D:
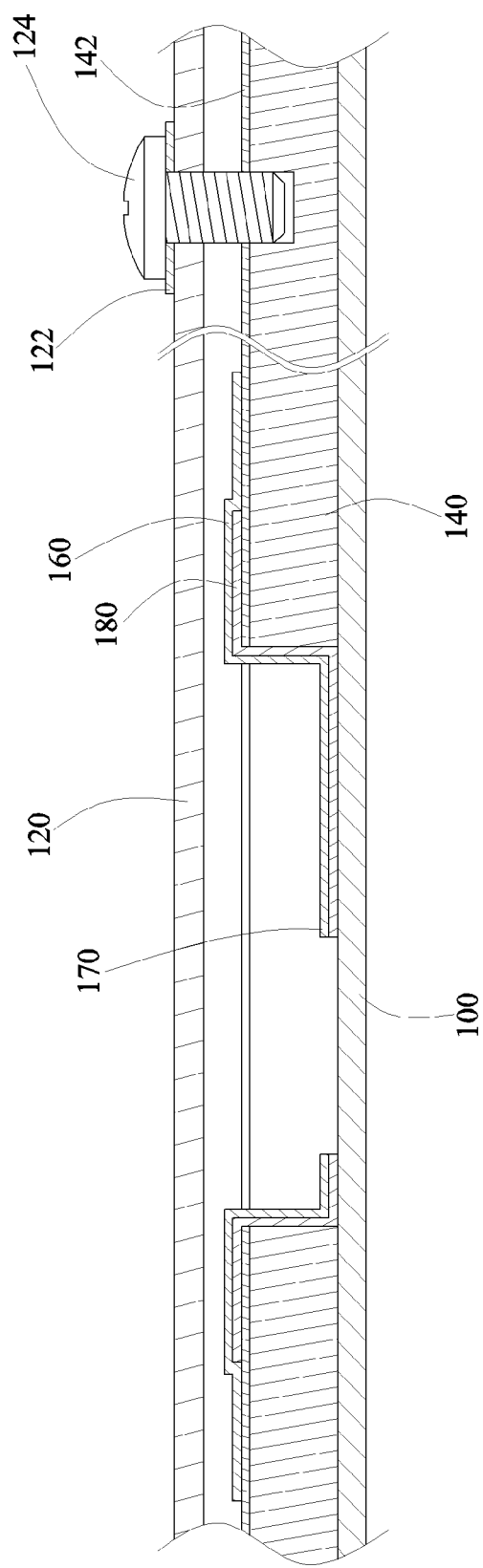
FIG. 1D is a schematic partial cross-sectional view of the electronic device with the electrostatic guiding structure according to the embodiment of the present invention.

Then referring to FIG. 1D, the plastic case 140 is disposed between the metal case 100 and the electronic module 120, and has a conductive region 142 on a surface thereof The conductive region 142 is electrically connected to the ground region 122 of the electronic module 120 by a conductive screw 124, such that the ground region 122 of the electronic module 120 is extended to the conductive region 142.

The aforementioned conductive region 142 may be formed on an inner surface (i.e., the surface facing the electronic module 120 or the surface opposite to the other surface facing the metal case) of the plastic case 140 in any metal coating manner such as metal sputtering, metal evaporation, metal water plating, or vacuum sputtering. A material for the metal sputtering (i.e., a material of the plastic case) may be, but not limited to, plastics, for example, poly(ethylene terephthalate) (PET) and other plastic materials. In addition, the conductive region 142 may also be a layer of metal sheet, for example, aluminum foil or copper foil.

The conductive strip 160 is disposed on the plastic case 140, and has one end electrically connected to the conductive region 142 of the plastic case 140 and the other end provided with at least one tip portion 170 (also called as a discharge portion). Besides, the tip portion 170 provides an end point (i.e., a point of the tip portion) (also called as a discharge point). As shown in the figure, the conductive strip 160 is electrically connected to the conductive region 142 by directly attaching the conductive strip 160 on a conductive layer (i.e., the conductive region 142) of the plastic case 140, but the other end of the conductive strip 160 is projected from the plastic case 140 and crosses the metal case 100 without being electrically connected to the metal case 100 (which will be described later in detail).

The conductive strip 160 may be any metal sheet or film, and may be, but not limited to, aluminum foil, copper foil, and other materials.

The electrically insulating strip 180 is disposed between the metal case 100 and the conductive strip 160, with the end point of the tip portion 170 of the conductive strip 160 located at an edge of the electrically insulating strip 180. Therefore, with the existence of the electrically insulating strip 180, the conductive strip 160 is separated by a specific distance from the metal case 100 instead of directly contacting the metal case 100, that is to say, no electrical connection exists between the two. Therefore, a distance (i.e., the aforementioned specific distance) between the end point of the tip portion 170 and the metal case 100 is exactly a thickness of the electrically insulating strip 180, that is to say, the specific distance may be achieved by selecting the electrically insulating strip 180 of a proper thickness. Herein, the specific distance may be approximately between 0.02 mm and 0.6 mm. The thickness of the electrically insulating strip 180 may be between about 0.01 mm and about 20 mm, and a general used thickness thereof may be between about 0.02 mm and 0.6 mm. The thickness of the electrically insulating strip 180 may be adjusted according to a magnitude of an electrostatic discharge voltage desired to achieve the protection.

The electrically insulating strip 180 may be made of any electrically insulating material, for example, an insulating cloth, a polyester film insulating strip (Mylar), a polyamide insulating tape (Kapton), and other materials.

Referring to FIGS. 1C and 1D, the electrically insulating strip 180 at a position corresponding to the tip portion 170 of the conductive strip 160 has the same shape as that of the tip portion 170, that is to say, a tip portion shape is similarly formed at corresponding positions of the electrically insulating strip 180 and the conductive strip 160. Therefore, when the metal case 100 accumulates a certain amount of electrostatic charges, the electrostatic charges are discharged to the end point of the tip portion 170 through the shortest distance between the metal case 100 and the tip portion 170 (the point discharge principle). Since the tip portion 170 is electrically connected to the ground region 122 of the electronic module 120, the accumulated electrostatic charge of the metal case 100 is guided to the ground region 122 smoothly.

Two experimental tests are performed on an electronic device with an electrostatic guiding structure according to one embodiment of the present invention, namely, an electrostatic test and a leakage current test. Herein, the electrostatic test is performed with two discharge voltages, and the test process is roughly as follows. First, the electronic device is started to be operated, and an electrostatic discharge value is adjusted to 8 kilovolts (KV). A test bar of an electrostatic test instrument directly contacts the metal case, and then the electrostatic test instrument is started to force the static electricity onto the metal case through the test bar. Afterwards, the electronic device is viewed to see if it operates normally, and it is detected whether excessive electrostatic charge remains on the metal case. This is the test of the first electrostatic discharge voltage.

The test of the second electrostatic discharge voltage is the same as that of the first electrostatic discharge voltage, but the employed electrostatic discharge value is adjusted from 8 KV up to an electrostatic discharge value of 15 KV.

Through the test of the two electrostatic discharge voltages, the test result shows that, when the thickness of the electrically insulating strip is approximately between 0.02 mm and 0.6 mm, i.e., the specific distance is approximately between 0.02 mm and 0.6 mm, the conductive strip may guide the static electricity to the ground region smoothly, which indicates that the electronic device with the electrostatic guiding structure according to one embodiment of the present invention passes the electrostatic test.

Furthermore, with regard to the aforementioned leakage current test, an electronic module that can intentionally generate a leakage current is mainly used. The electronic module is disposed within the electronic device and caused to generate the leakage current. It is detected whether the leakage current generated by the electronic module is conducted to the metal case to make the user get an electric shock. Through this test, when the electrically insulating strip with the thickness between 0.02 mm and 0.6 mm is used, the conductive strip may guide the static electricity generated on the metal case to the ground region, and no leakage current is measured on the metal case, which indicates that the electronic device with the electrostatic guiding structure according to one embodiment of the present invention passes the leakage current test.

In fabricating the electronic device 10 with the electrostatic guiding structure according to the present invention, the conductive strip 160 may be directly bonded with the electrically insulating strip 180, and one end (i.e., right side of FIG. 1C) of the conductive strip 160 is slightly longer or larger than the electrically insulating strip 180. Afterwards, the other end (i.e., left side of FIG. 1C) opposite to the slightly longer end of the conductive strip 160 is cut into a tip portion 170. The cutting manner is simultaneously applied to the conductive strip 160 and the electrically insulating strip 180, so as to form the aforementioned tip portion 170. Afterwards, the conductive strip 160 and the electrically insulating strip 180 are bonded at a common boundary between the plastic case 140 and the metal case 100. One end (i.e., the aforementioned slightly longer end) of the conductive strip 160 projected from the electrically insulating strip 180 is bonded on the plastic case 140, so as to form an electrical connection between the conductive strip 160 and the conductive region 142 of the plastic case 140. The other end of the conductive strip 160 is projected from the plastic case 140 to be disposed above the metal case 100. In this way, the fabrication of the present invention is accomplished.

According to the point discharge principle, the electrostatic charge generated by the metal case 100 is guided to the conductive region 142 of the plastic case 140 and thus guided to the ground by the end point of the tip portion 170 of the conductive strip 160. However, the implementation aspect in which the conductive strip 160 and the electrically insulating strip 180 form the electrostatic guiding structure is not limited to the above structure and may be the structure design shown in FIGS. 2 to 7, in which the electrostatic charge is guided by end points in different implementation aspects.

Figure 2:
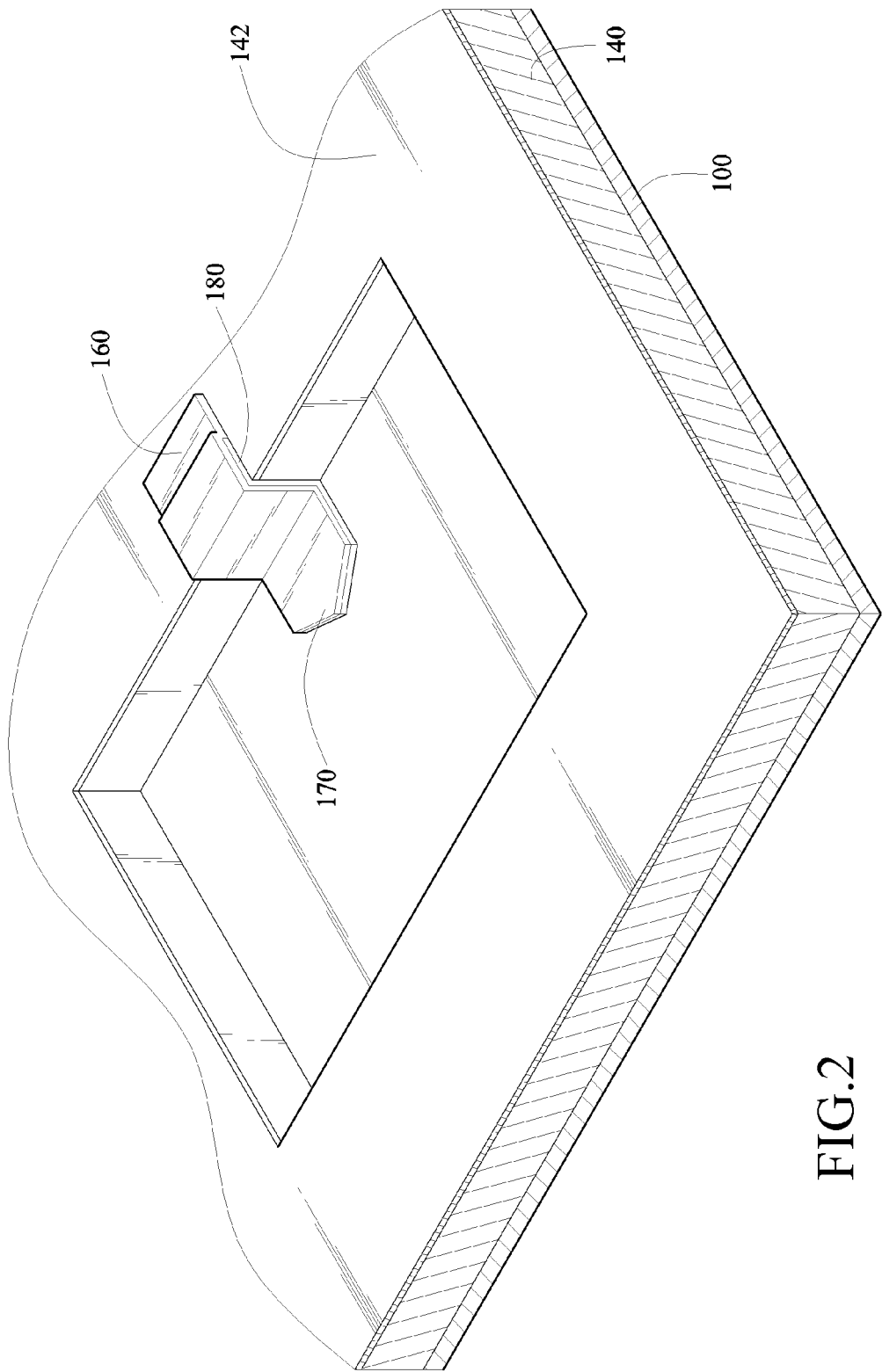
FIG. 2 is a schematic view illustrating a second implementation aspect of the electronic device with the electrostatic guiding structure according to the embodiment of the present invention.
Figure 3:
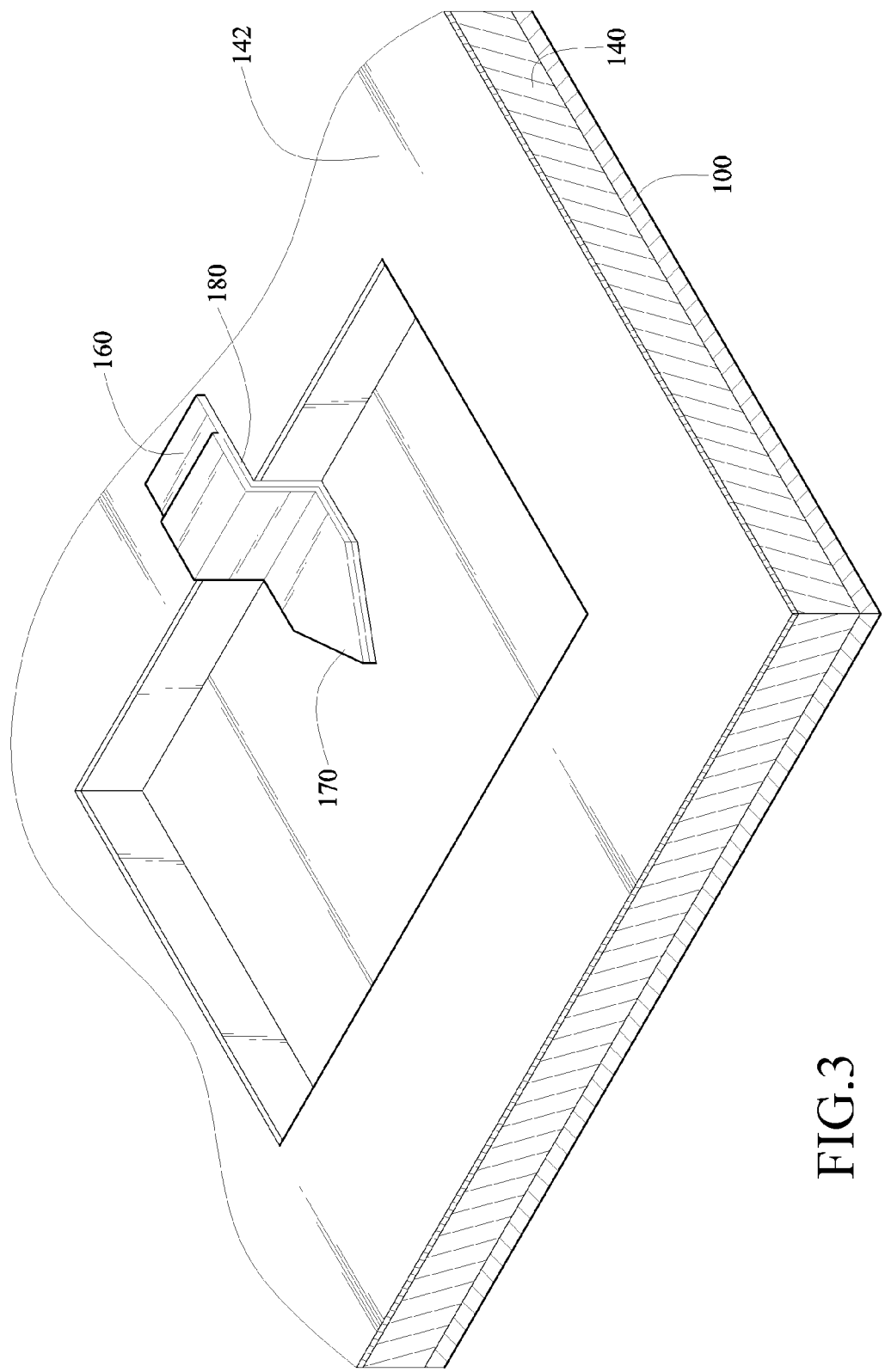
FIG. 3 is a schematic view illustrating a third implementation aspect of the electronic device with the electrostatic guiding structure according to the embodiment of the present invention.
Figure 4:
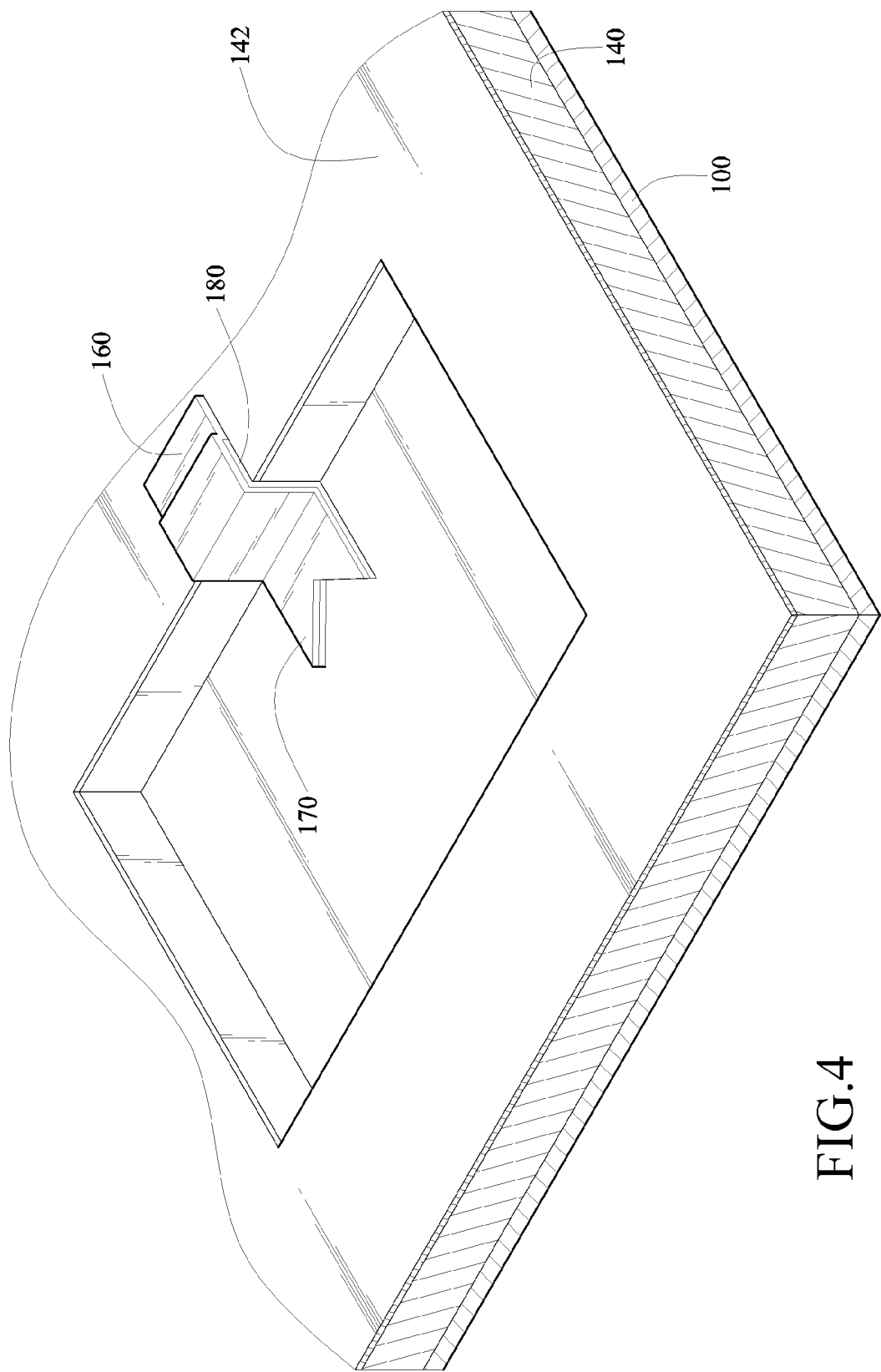
FIG. 4 is a schematic view illustrating a fourth implementation aspect of the electronic device with the electrostatic guiding structure according to the embodiment of the present invention.
Figure 5:
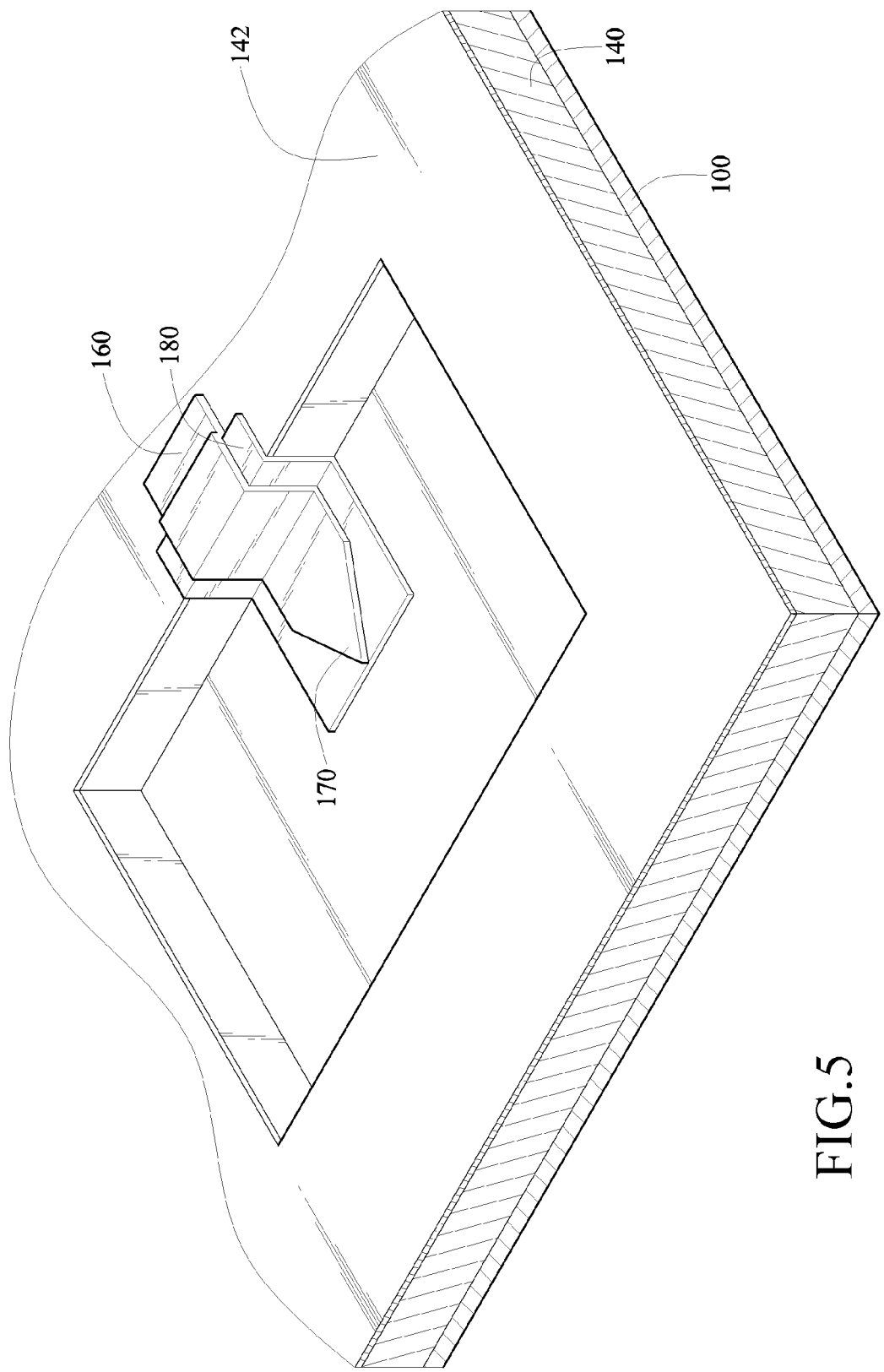
FIG. 5 is a schematic view illustrating a fifth implementation aspect of the electronic device with the electrostatic guiding structure according to the embodiment of the present invention.
Figure 6:
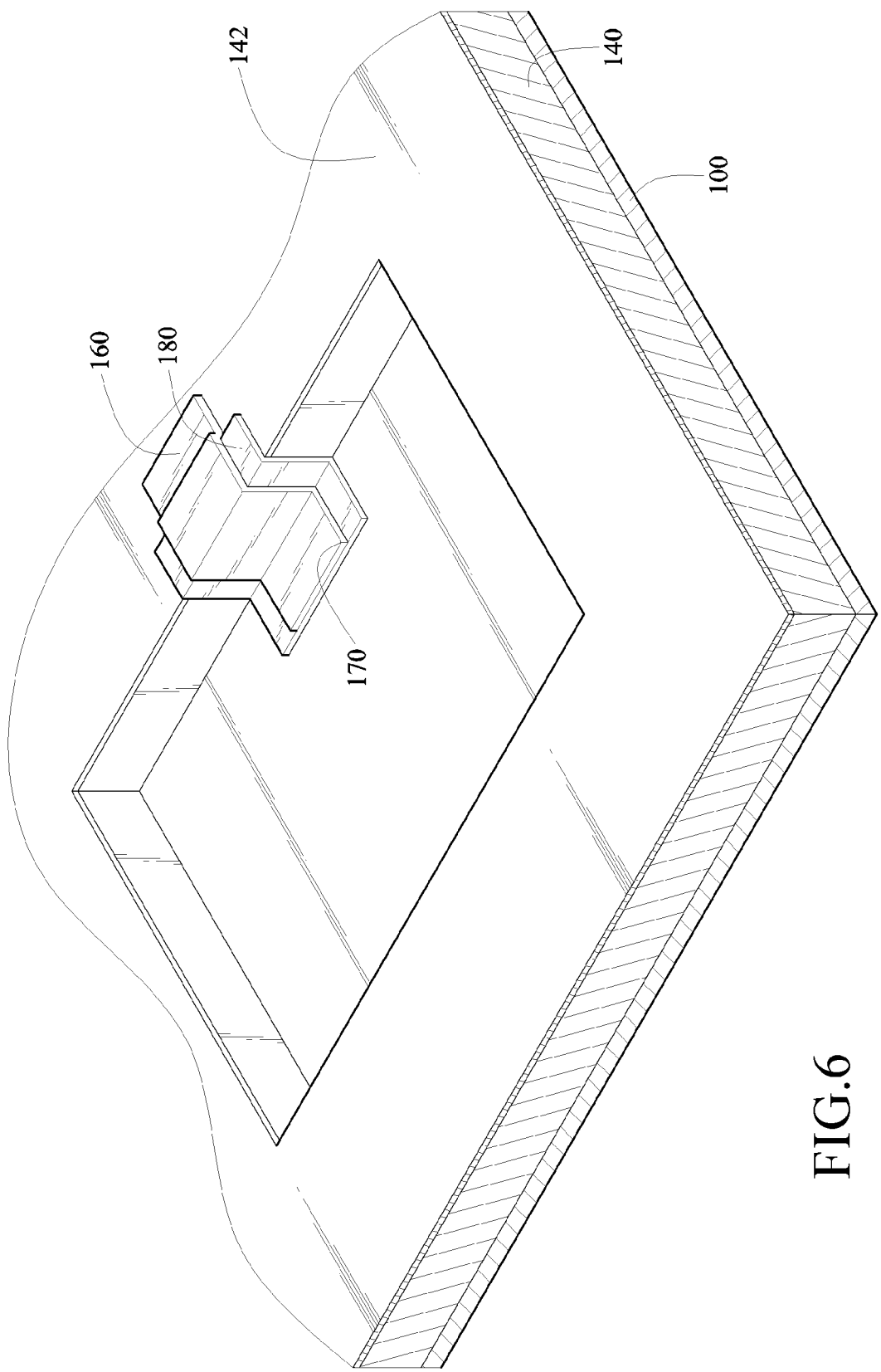
FIG. 6 is a schematic view illustrating a sixth implementation aspect of the electronic device with the electrostatic guiding structure according to the embodiment of the present invention.

The tip portion 170 shown in FIG. 2 assumes an obtuse angle. The tip portion 170 shown in FIG. 3 assumes an acute angle. The tip portion 170 shown in FIG. 4 is two tip portions in a recessed V shape formed by distal ends of the conductive strip 160 and the electrically insulating strip 180. The tip portion 170 shown in FIG. 5 is located at the edge of the electrically insulating strip 180, and the area of the electrically insulating strip 180 adjacent to the metal case 100 is larger than that of the conductive strip on the metal case 100. As shown in FIG. 6, the original simultaneous cut of the conductive strip 160 and the electrically insulating strip 180 to form a tip portion 170 is changed into simultaneous cut as flat. The electrostatic charges may be similarly guided to the ground region 122 of the electronic module 120 through the end point of the tip portion 170 formed by an intersection of two sides of the conductive strip 160. In other words, one side of the conductive strip 160 opposite to another side thereof connected to the conductive region 142 of the plastic case 140 overlaps a side of the electrically insulating strip 180, and is smaller than the side of the electrically insulating strip 180.

The electrostatic charges generated by the metal case 100 is guided to the conductive region 142 of the plastic case 140 by the tip portion 170 in different implementation aspects, and is eliminated by the ground region 122 of the electronic module 120 electrically connected to the conductive region 142.

Figure 7:
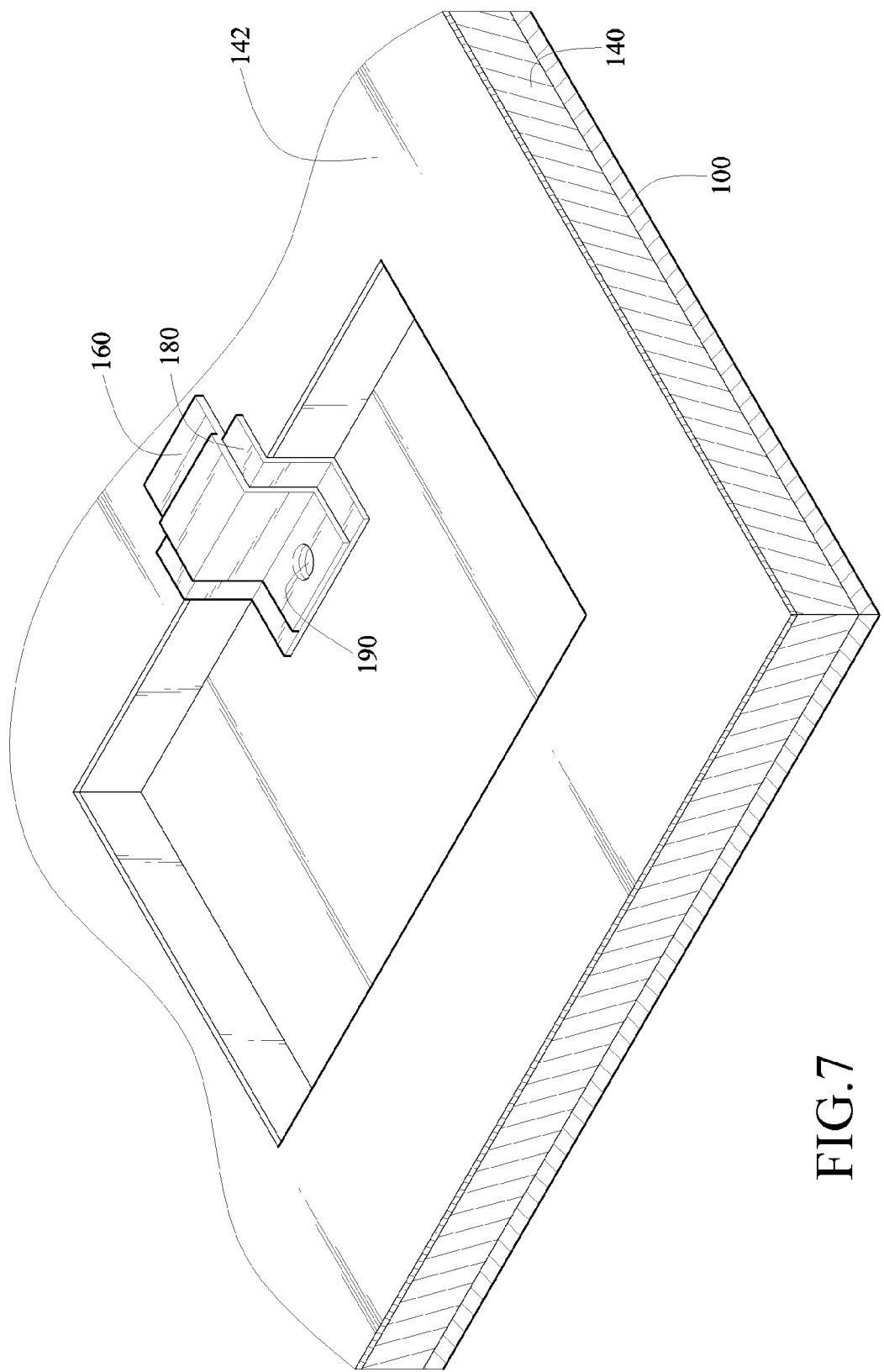
FIG. 7 is a schematic view illustrating a seventh implementation aspect of the electronic device with the electrostatic guiding structure according to the embodiment of the present invention.

In another embodiment, referring to FIG. 7, at least one through hole 190 with random shape may be formed on the conductive strip 160 and the electrically insulating strip 180. That is, the through hole 190 penetrates the conductive strip 160 and the electrically insulating strip 180, and the through hole 190 exposes the metal case 100. Herein, the electrostatic charges generated by the metal case 100 may also be guided to the conductive region 142 of the plastic case 140 through an inner edge of the through hole 190. In other words, the through hole 190 may be regarded as consisting of multiple end points, such that the point discharge phenomenon may be induced by an interface formed at the through hole 190 between the conductive strip 160 and the electrically insulating strip 180. Therefore, the electrostatic charges on the metal case 100 is guided to the conductive region 142 of the plastic case 140 by the inner edge of the through hole 190.

In addition, an opening (as shown in FIG. 1B) may be formed on the plastic case 140 to expose the metal case 100. The electrically insulating strip 180 may be disposed within the opening of the plastic case 140 or cross the edges of the opening of the plastic case 140, and the conductive strip 160 crosses the edges of the opening of the plastic case 140, such that a portion of the conductive strip 160 is located on the metal case 100 and the other portion of the conductive strip 160 is located on the plastic case 140. Furthermore, although not shown, the electrically insulating strip may be directly disposed at outer edge of the plastic case and cover the surface of the metal case, or cross the outer edge of the plastic case and cover the surface of the metal case, and the conductive strip crosses the outer edge of the plastic case, such that a portion of the conductive strip is located above the metal case and the other portion of the conductive strip is located on the plastic case.

In view of the above, the electronic device with the electrostatic guiding structure disclosed according to the present invention mainly combines the electronic device with the electrostatic guiding structure. The electrostatic charges generated by the metal case of the electronic device are guided to the conductive region of the plastic case by the electrostatic guiding structure. The electrostatic charges are guided to the conductive region through the tip portion of the conductive strip, and are eliminated by the ground region of the electronic module electrically connected to the conductive region. Therefore, the static electricity is eliminated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic device with an electrostatic guiding structure, comprising:
    a metal case;
    an electronic module, disposed in the metal case and having a ground region;
    a plastic case, disposed between the metal case and the electronic module, and having a conductive region electrically connected to the ground region;
    a conductive strip, one end of the conductive strip electrically connected to the conductive region and the other end of the conductive strip having at least one end point; and
    an electrically insulating strip, disposed between the metal case and the conductive strip, wherein the end point is located at an edge of the electrically insulating strip and the electrically insulating strip separates the end point from the metal case by a specific distance.

2. The electronic device with an electrostatic guiding structure according to claim 1, wherein the conductive strip has at least one tip portion to provide the end point.

3. The electronic device with an electrostatic guiding structure according to claim 2, wherein the tip portion is an acute angle.

4. The electronic device with an electrostatic guiding structure according to claim 2, wherein the tip is an obtuse angle.

5. The electronic device with an electrostatic guiding structure according to claim 2, wherein the electrically insulating strip corresponding to the tip portion has the same shape as that of the tip portion.

6. The electronic device with an electrostatic guiding structure according to claim 1, wherein a side of the conductive strip opposite to another side of the conductive strip connected to the conductive region overlaps a side of the electrically insulating strip where the end point is located, and the side of the conductive strip is smaller than the overlapped side of the electrically insulating strip.

7. The electronic device with an electrostatic guiding structure according to claim 1, further comprising at least one through hole penetrating the conductive strip and the electrically insulating strip and exposing the metal case, wherein the end point is located at an edge of the through hole.

8. The electronic device with an electrostatic guiding structure according to claim 1, wherein the electrically insulating strip has a thickness of 0.02 mm to 0.6 mm.

9. The electronic device with an electrostatic guiding structure according to claim 1, wherein the specific distance is 0.02 mm to 0.6 mm.

10. An electronic device with an electrostatic guiding structure, comprising:
    a metal case;
    a conductive strip, one end of the conductive strip electrically connected to a conductive region and the other end of the conductive strip having at least one end point; and
    an electrically insulating strip, disposed between the metal case and the conductive strip, wherein the end point is located at an edge of the electrically insulating strip and the electrically insulating strip separate the end point from the metal case by a specific distance.

11. The electronic device with an electrostatic guiding structure according to claim 10, further comprising:
    an electronic module, disposed inside the metal case and having a ground region; and
    a plastic case, disposed between the metal case and the electronic module and having the conductive region electrically connected to the ground region.

12. The electronic device with an electrostatic guiding structure according to claim 10, wherein the conductive strip has at least one tip portion to provide the end point.

13. The electronic device with an electrostatic guiding structure according to claim 12, wherein the tip portion is an acute angle.

14. The electronic device with an electrostatic guiding structure according to claim 12, wherein the tip portion is an obtuse angle.

15. The electronic device with an electrostatic guiding structure according to claim 12, wherein a portion of the electrically insulating strip corresponding to the tip portion has the same shape as that of the tip portion.

16. The electronic device with an electrostatic guiding structure according to claim 10, wherein a side of the conductive strip opposite to another side of the conductive strip connected to the conductive region overlaps a side of the electrically insulating strip, and the side of the conductive strip is smaller than the overlapped side of the electrically insulating strip.

17. The electronic device with an electrostatic guiding structure according to claim 10, further comprising at least one through hole penetrating the conductive strip and the electrically insulating strip and exposing the metal case, wherein the end point is located at an edge of the through hole.

18. The electronic device with an electrostatic guiding structure according to claim 10, wherein the electrically insulating strip has a thickness of 0.02 mm to 0.6 mm.

19. The electronic device with an electrostatic guiding structure according to claim 10, wherein the specific distance is 0.02 mm to 0.6 mm.

* * * * *